United States Patent [19]
Kerstein et al.

[11] Patent Number: 6,011,799
[45] Date of Patent: Jan. 4, 2000

[54] METHOD AND APPARATUS FOR MANAGING EXTERNAL PHYSICAL LAYER DEVICES

[75] Inventors: Denise Kerstein, Mountain View; Philip Simmons, San Jose; Ian Lam, Daly City, all of Calif.

[73] Assignee: Advanced Micro Devices, Inc., Sunnyvale, Calif.

[21] Appl. No.: 08/992,926

[22] Filed: Dec. 18, 1997

Related U.S. Application Data
[60] Provisional application No. 60/038,025, Feb. 14, 1997.

[51] Int. Cl.⁷ .......................... H04L 12/28; H04L 12/56; G05B 19/02
[52] U.S. Cl. .................. 370/422; 370/449; 340/825.08
[58] Field of Search .......................... 370/282, 296, 370/360, 379, 391, 392, 401, 422, 449, 475, 503; 340/825.08, 825.21, 825.52, 825.54; 709/229, 249; 710/8, 19

[56] References Cited

U.S. PATENT DOCUMENTS

| | | | |
|---|---|---|---|
| 5,394,390 | 2/1995 | Stauffer et al. | 370/17 |
| 5,515,376 | 5/1996 | Murthy et al. | |
| 5,734,642 | 3/1998 | Vaishnavi et al. | 370/255 |
| 5,809,249 | 9/1998 | Julyan | 395/200.53 |

Primary Examiner—Hassan Kizou
Assistant Examiner—Duc Ho

[57] ABSTRACT

Every external physical layer device coupled to a multiport data communication switch is polled in succession to determine status and control information relating to the external physical layer device. The polling procedure performed automatically at regular time intervals is interleaved with management accesses to the external PHYs initiated by a host processor. The host management access may be performed to write or read management data to or from a particular register in a particular external physical layer device.

17 Claims, 8 Drawing Sheets

Fig. 5

| | | | Management Frame Fields | | | | |
|---|---|---|---|---|---|---|---|
| | Preamble | ST | OP | PHYAD | REGAD | TA | DATA | IDLE |
| READ | 1........1 | 01 | 10 | AAAAA | RRRRR | Z0 | DDDDDDDDDDDDDDDD | Z |
| WRITE | 1........1 | 01 | 01 | AAAAA | RRRRR | 10 | DDDDDDDDDDDDDDDD | Z |

ST = start of frame, OC = opcode, TA = turn-around

METHOD AND APPARATUS FOR MANAGING EXTERNAL PHYSICAL LAYER DEVICES

The present application claims the priority of provisional application No. 60/038,025, filed Feb. 14, 1997.

TECHNICAL FIELD

This invention relates to data communication systems, and more particularly, to a system that enables a communication switch to manage physical layer devices connected to communication ports.

BACKGROUND ART

In a data communication system, a multiport switch may be provided to enable data communication between various physical layer devices connected to ports of the switch. The IEEE 802 standard defines physical layer protocols and interfaces that govern data transmission between physical layer devices. In particular, the IEEE 802.3 standard developed for Ethernet networks requires each physical layer device (PHY) to incorporate a status register that indicates the status of the PHY. For example, the IEEE 802.3 status register contains link transmission bits that indicate the ability of the PHY to operate in specific link transmission and reception modes such as full duplex or half duplex modes, link status bits, a preamble suppression bit that indicates whether the PHY will accept management frames with preamble suppressed, jabber detect bits indicating whether or not the jabber condition is invoked, auto-negotiation bits indicating the ability of the PHY to perform the IEEE 802.3 auto-negotiation protocol, etc.

To obtain status information from an external PHY, a network controller or switch reads the status register of the PHY. As a multiport data communication switch supports data communication between multiple physical layer devices, it would be desirable to provide the switch that performs an auto-polling procedure to interrogate in succession every external PHY connected to the switch.

Furthermore, it would be desirable to combine the auto-polling procedure with a direct management access to a particular PHY connected to the switch.

DISCLOSURE OF THE INVENTION

Accordingly, one advantage of the present invention is in providing a multiport switch that performs an auto-polling procedure to interrogate in succession every external physical layer device connected to the switch.

Another advantage of the present invention is in providing a multiport switch that combines the auto-polling procedure with a direct management access to a particular physical layer device connected to the switch.

The above and other advantages of the invention are achieved, at least in part, by providing a data communication switch having a management data interface for automatically polling external physical layer devices at regular time intervals. A management access register is provided in the switch for storing management access information provided by a host processor to support host management accesses to the physical layer devices initiated by the host processor. In response to the management access information from the management access register, the management data interface alternates the polling with the host management accesses.

In accordance with one aspect of the present invention, to support writing management data into a selected external physical layer device (PHY), the host processor places the management data, the address of the selected external PHY and the address of a selected register in the external PHY into the management access register. For example, the host may write management data into the PHY to alter its operating parameters or configuration.

In accordance with another aspect of the invention, when the host processor initiates reading management data from a selected external PHY, it places the address of the selected PHY and the address of a selected register in the PHY into the management access register. The management data read from the selected register is placed into the management access register.

In accordance with a further aspect of the invention, the management data interface may use a management data clock (MDC) and a management data input/output (MDIO) signal defined in the IEEE 802.3u standard to provide the polling and the host management access. In particular, the MDIO signal may carry address and management data for the host management access.

In accordance with another aspect of the invention, the host processor may access the management access register via a PCI interface.

In accordance with a method of the present invention the following steps are carried out to manage external physical layer devices coupled to ports of a data communication switch controlled by a host processor:

automatically polling the external physical layer devices at regular time intervals, supplying an access register in the data communication switch with management access information provided by the host processor to support management accesses to the external physical layer devices, and alternating the polling with the management accesses to the external physical layer devices.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature and not as restrictive.

BRIEF DESCRIPTION OF DRAWINGS

FIG. 5 illustrates the format of a management data frame.

BEST MODE FOR CARRYING OUT THE INVENTION

Figure 1:
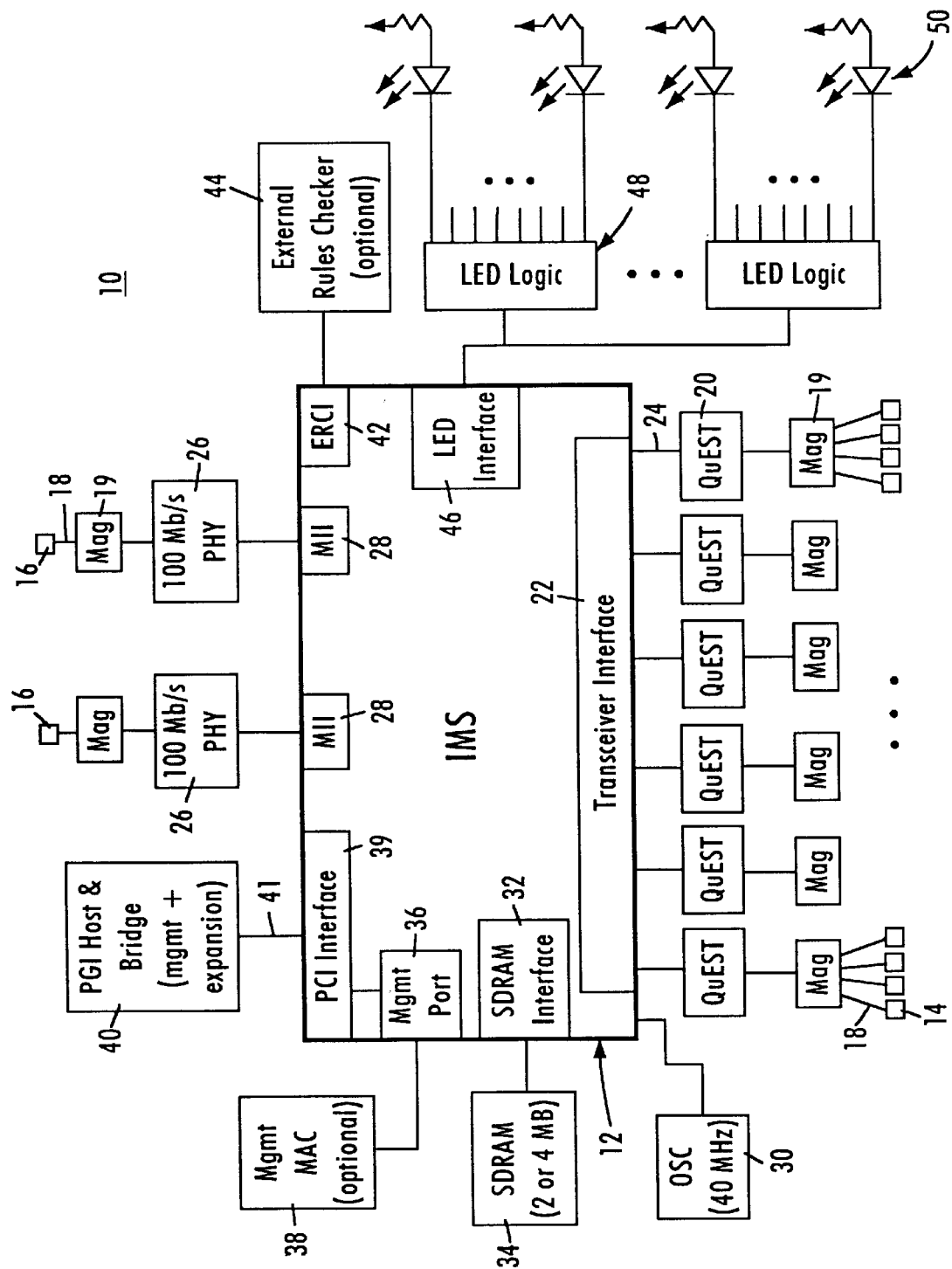
FIG. 1 is a block diagram of an exemplary system in which the present invention may be advantageously employed.

FIG. 1 is a block diagram of an exemplary system in which the present invention may be advantageously employed. The exemplary system 10 is a packet switched network, such as an Ethernet network. The packet switched network includes an integrated multiport switch (IMS) 12 that enables communication of data packets between network stations. The network may include network stations having different configurations, for example twenty-four (24) 10 megabit per second (Mb/s) network stations 14 that send and receive data at a network data rate of 10 Mb/s, and two 100 Mb/s network stations 16 that send and receive data packets at a network speed of 100 Mb/s. The multiport switch 12 selectively forwards data packets received from the network stations 14 or 16 to the appropriate destination based upon Ethernet protocol.

According to the disclosed embodiment, the 10 Mb/s network stations 14 send and receive data packets to and from the multiport switch 12 via a media 18 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 18. Rather, each station 14 includes an Ethernet interface card that uses carrier-sense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media, known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 100 Mb/s network stations 16 preferably operate in full-duplex mode according to the proposed Ethernet standard IEEE 802.3x Full-Duplex with Flow Control—Working Draft (0.3). The full-duplex environment provides a two-way, point-to-point communication link between each 100 Mb/s network station 16 and the multiport switch 12, where the IMS and the respective stations 16 can simultaneously transmit and receive data packets without collisions. The 100 Mb/s network stations 16 each are coupled to network media 18 via 100 Mb/s physical (PHY) devices 26 of type 100 Base-TX, 100 Base-T4, or 100 Base-FX. The multiport switch 12 includes a media independent interface (MII) 28 that provides a connection to the physical devices 26. The 100 Mb/s network stations 16 may be implemented as servers or routers for connection to other networks. The 100 Mb/s network stations 16 may also operate in half-duplex mode, if desired. Similarly, the 10 Mb/s network stations 14 may be modified to operate according to full-duplex protocol with flow control.

As shown in FIG. 1, the network 10 includes a series of switch transceivers 20 that perform time division multiplexing and time division demultiplexing for data packets transmitted between the multiport switch 12 and the 10 Mb/s stations 14. A magnetic transformer module 19 maintains the signal waveform shapes on the media 18. The multiport switch 12 includes a transceiver interface 22 that transmits and receives data packets to and from each switch transceiver 20 using a time-division multiplexed protocol across a single serial non-return to zero (NRZ) interface 24. The switch transceiver 20 receives packets from the serial NRZ interface 24, demultiplexes the received packets, and outputs the packets to the appropriate end station 14 via the network media 18. According to the disclosed embodiment, each switch transceiver 20 has four independent 10 Mb/s twisted-pair ports and uses 4:1 multiplexing across the serial NRZ interface enabling a four-fold reduction in the number of PINs required by the multiport switch 12.

The multiport switch 12 contains a decision making engine, switching engine, buffer memory interface, configuration/control/status registers, management counters, and MAC (media access control) protocol interface to support the routing of data packets between the Ethernet ports serving the network stations 14 and 16. The multiport switch 12 also includes enhanced functionality to make intelligent switching decisions, and to provide statistical network information in the form of management information base (MIB) objects to an external management entity, described below. The multiport switch 12 also includes interfaces to enable external storage of packet data and switching logic in order to minimize the chip size of the multiport switch 12. For example, the multiport switch 12 includes a synchronous dynamic RAM (SDRAM) interface 32 that provides access to an external memory 34 for storage of received frame data, memory structures, and MIB counter information. The memory 34 may be an 80, 100 or 120 MHz synchronous DRAM having a memory size of 2 or 4 Mb.

The multiport switch 12 also includes a management port 36 that enables an external management entity to control overall operations of the multiport switch 12 via a management MAC interface 38. Also, the multiport switch 12 includes a PCI interface 39 connected to a host processor 40 via a PCI bus 41. The PCI interface 39 enables the PCI host processor 40 to access the internal IMS registers and the external memory 34. Alternatively, a PCI expansion bus may be attached to the PCI interface 39 to connect the switch 12 to other IMS devices.

The multiport switch 12 includes an internal decision making engine that selectively transmits data packets received from one source to at least one destination station. The internal decision making engine may be substituted with an external rules checker. The multiport switch 12 includes an external rules checker interface (ERCI) 42 that allows use of an external rules checker 44 to make frame forwarding decisions in place of the internal decision making engine. Hence, frame forwarding decisions can be made either by the internal switching engine or the external rules checker 44.

The multiport switch 12 also includes an LED interface 46 that clocks out the status of conditions per port and drives LED external logic 48. The LED external logic 48, in turn, drives LED display elements 50 that are human readable. An oscillator 48 provides a 40 MHz clock input for the system functions of the multiport switch 12.

Figure 2A:
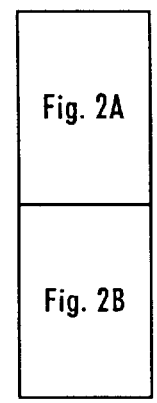
FIG. 2 is a block diagram of a multiport switch.
Figure 2A:
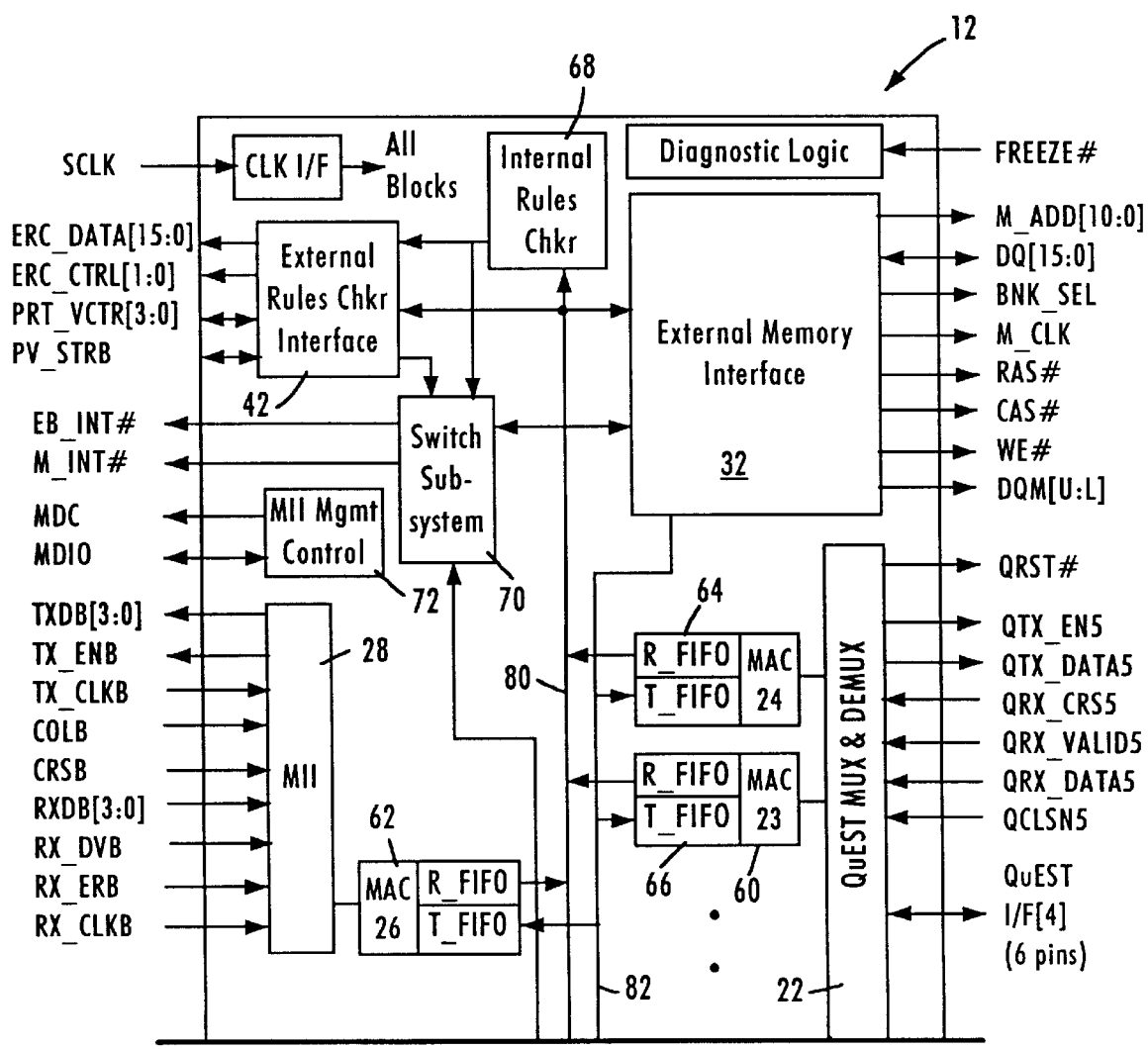
Figure 2B:
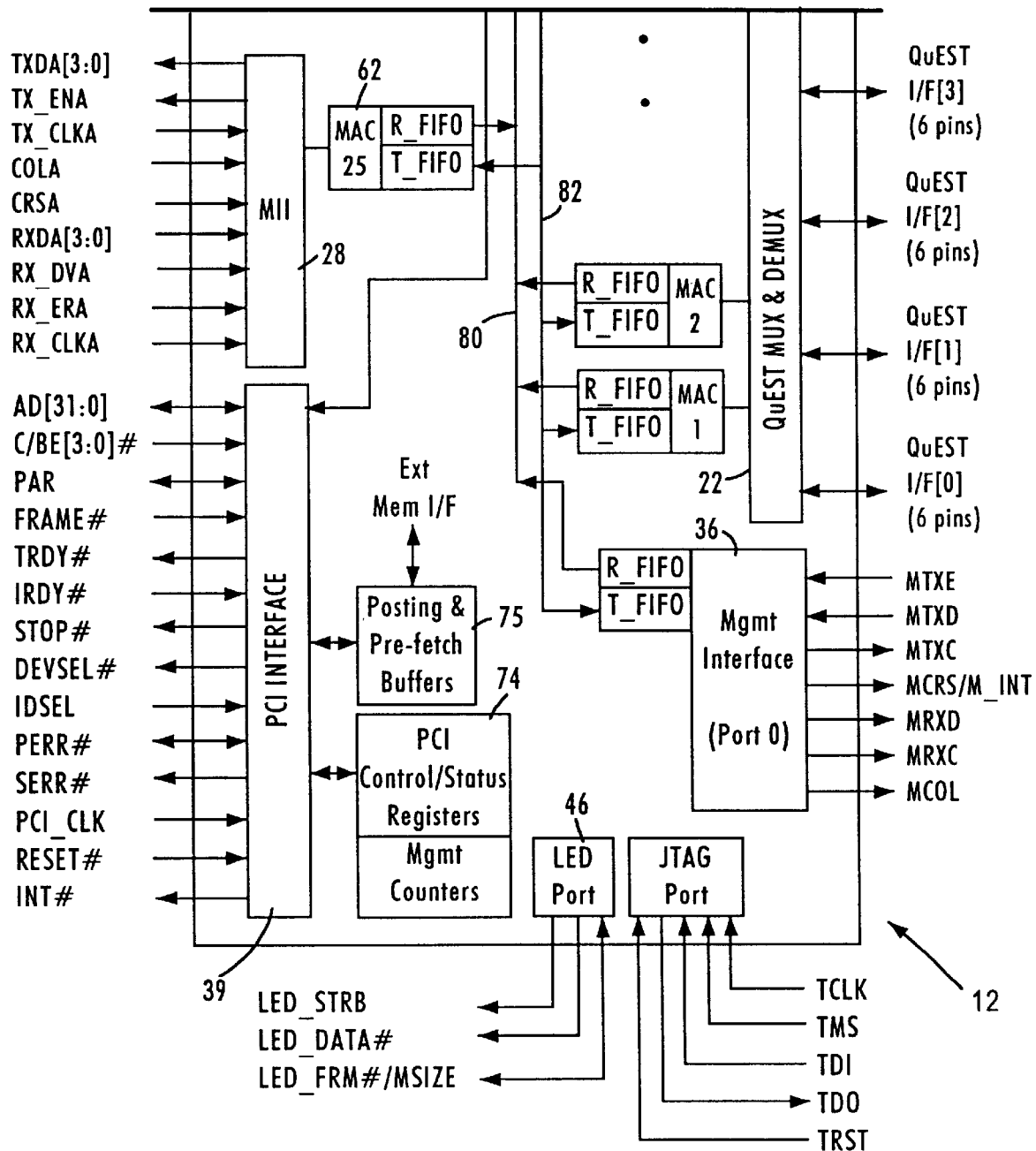

FIG. 2 is a block diagram of the multiport switch 12 of FIG. 1. The multiport switch 12 includes twenty-four (24) 10 Mb/s media access control (MAC) ports 60 for sending and receiving data packets in half-duplex between the respective 10 Mb/s network stations 14 (ports 1–24), and two 100 Mb/s MAC ports 62 for sending and receiving data packets in full-duplex between the respective 100 Mb/s network stations 16 (ports 25, 26). As described above, the management interface 36 also operates according to MAC layer protocol (port 0). Each of the MAC ports 60, 62 and 36 has a receive first in-first out (FIFO) buffer 64 and transmit FIFO 66. Data packets from a network station are received by the corresponding MAC port and stored in the corresponding receive FIFO 64. The received data packet is output from the corresponding receive FIFO 64 to the external memory interface 32 for storage in the external memory 34.

The header of the received packet is also forwarded to a decision making engine, comprising an internal rules checker 68 and an external rules checker interface 42, to determine which MAC ports will output the data packet. Specifically, the packet header is forwarded to an internal rules checker 68 or the external rules checker interface 42, depending on whether the multiport switch 12 is configured to operate using the internal rules checker 68 or the external rules checker 44. The internal rules checker 68 and external rules checker 44 provide the decision making logic for determining the destination MAC port for a given data packet. The decision making engine may thus output a given data packet to either a single port, multiple ports, or all ports (i.e., broadcast). For example, each data packet includes a header having source and destination address, where the decision making engine may identify the appropriate output MAC port based upon the destination address. Alternatively, the destination address may correspond to a virtual address that the appropriate decision making engine identifies as corresponding to a plurality of network stations. Alternatively, the received data packet may include a VLAN (virtual LAN) tagged frame according to IEEE 802.1d protocol that specifies another network (via a router at one of the 100 Mb/s stations 16) or a prescribed group of stations. Hence, either the internal rules checker 68 or the external rules checker 44 via the interface 42 will decide whether a frame temporarily stored in the buffer memory 34 should be output to a single MAC port or multiple MAC ports.

Use of the external rules checker 44 provides advantages such as increased capacity, a random-based ordering in the decision queue that enables frame forwarding decisions to be made before the frame is completely buffered to external memory, and enables decisions to be made in an order independent from the order in which the frames were received by the multiport switch 12.

The decision making engine (i.e., internal rules checker 68 or the external rules checker 44) outputs a forwarding decision to a switch subsystem 70 in the form of a port vector identifying each MAC port that should receive the data packet. The port vector from the appropriate rules checker includes the address location storing the data packet in the external memory 34, and the identification of the MAC ports to receive the data packet for transmission (e.g., MAC ports 0–26). The switch subsystem 70 fetches the data packet identified in the port vector from the external memory 34 via the external memory interface 32, and supplies the retrieved data packet to the appropriate transmit FIFO 66 of the identified ports.

Additional interfaces provide management and control information. For example, a management data interface 72 enables the multiport switch 12 to exchange control and status information with the switch transceivers 20 and the 100 Mb/s physical devices 26 according to the MII management specification (IEEE 802.3u). For example, the management data interface 72 outputs a management data clock (MDC) providing a timing reference on the bidirectional management data IO (MDIO) signal path.

The PCI interface 39 may be a 32-bit PCI revision 2.1 compliant slave interface for providing the PCI host processor 40 with access to internal IMS status and configuration registers 74, and to the external memory SDRAM 34.

Write posting and read prefetch buffers 75 are arranged between the PCI interface 39 and the external memory interface to support host processor access to the external memory 32. The PCI interface 39 can also be coupled to an expansion bus for connecting multiple IMS devices with each other.

The management port 36 interfaces to an external MAC engine through a standard seven-wire inverted serial GPSI interface, enabling a host controller access to the multiport switch 12 via a standard MAC layer protocol.

Figure 3:
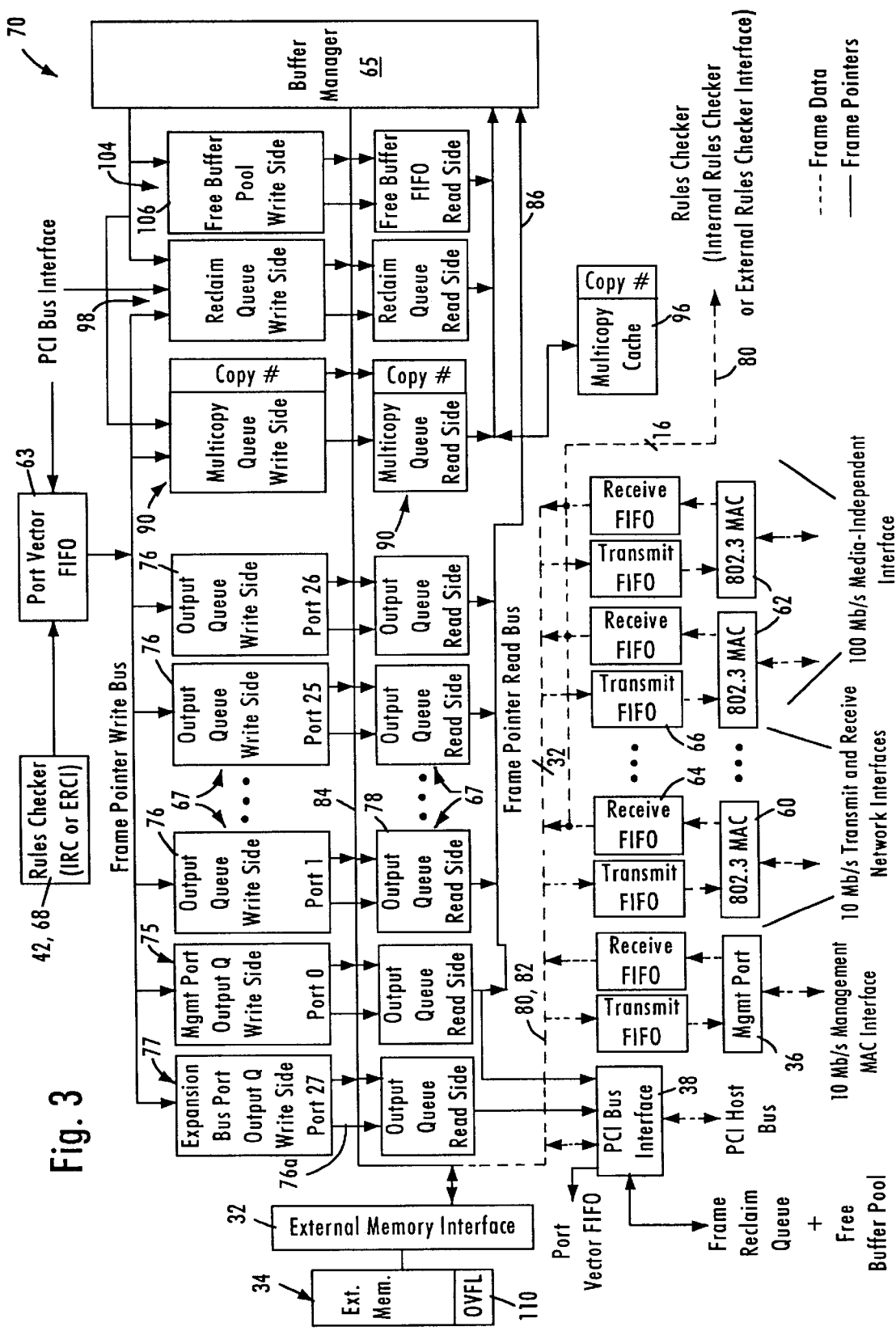
FIG. 3 depicts the switch subsystem of the multiport switch according to an exemplary embodiment of the present invention.

FIG. 3 depicts the switch subsystem 70 of FIG. 2 according to an exemplary embodiment of the present invention. Other elements of the multiport switch 12 of FIG. 2 are reproduced in FIG. 3 to illustrate the connections of the switch subsystem 70 to these other elements. The switch subsystem 70 contains the core switching engine for receiving and forwarding frames. The main functional blocks used to implement the switching engine include: a port vector FIFO 63, a buffer manager 65, a plurality of port output queues 67, a management port output queue 75, an expansion bus port output queue 77, a free buffer pool 104, a multicopy queue 90, a multicopy cache 96 and a reclaim queue 98. The operation and structure of these functional blocks will be described in more detail, but a brief overview of the switch subsystem 70 of FIG. 3 is first presented to provide context to the later discussion of the individual elements.

There are two basic types of frames that enter the multiport switch 12 from the ports: unicopy frames and multicopy frames. A unicopy frame is a frame that is received at a port which is to be transmitted by the multiport switch 12 to only one other port. By contrast, a multicopy frame is a frame that is received at one port for transmission to more than one port. In FIG. 3, each port is represented by a corresponding MAC 60, 62, or 36 having its own receive FIFO 64 and transmit FIFO 66.

Frames, whether unicopy or multicopy, are received by the internal MAC engines 60, 62, or 36, and placed in the corresponding receive FIFO 64. Each data frame has a header including at least a destination address, a source address, and type/length information. The header is provided to a rules checker (i.e., either the internal rules checker 68 or the external rules checker interface 42). The rules checker, based on the information in the header, determines from where the frame packet will be cast, i.e., through which port or ports will the frame packet be transmitted.

At the same time as the rules checker 42 or 68 is making its forwarding determination, the buffer manager 65 obtains a free frame pointer from the free buffer pool 104. The free frame pointer specifies a location in external memory 36 available for storing the data frame currently stored in the receive FIFO 64. The buffer manager 65 transfers the data frame from the receive FIFO 64 over a data bus 80 (see FIG. 2) to the external memory 34 in a direct memory access (DMA) transaction, and the data frame is stored in the location pointed to by the free frame pointer obtained from the free buffer pool 104.

The buffer manager 65 also sends the free frame pointer to the rules checker 42 or 68 to enable the appropriate rules checker to process the header information while maintaining the storage location of the data frame. This free buffer pointer is now referred to merely as a frame pointer since it points to the memory location in the external memory 34 where the frame is stored. The rules checker 42 or 68 makes the forwarding decision, where the rules checker identifies at least one destination port for the data frame stored in the external memory 34 based on the corresponding header information and generates a forwarding instruction in the form of a "port vector". In the exemplary illustrated embodiment, the port vector is a 28-bit vector with a bit set for each output port identified as a destination port to which the data frame should be forwarded. Assuming that the received frame is a unicopy frame, only one bit corresponding to the one destination port is set in the port vector generated by the rules checker 42 or 68. Hence, the rules checker uses the port vector to assign the frame pointer to at least one destination port.

The rules checker 42 or 68 places the port vector and the corresponding frame pointer (as well as a control opcode and a VLAN index) into the port vector FIFO 63. The port vector is examined by the port vector FIFO 63 to determine into which particular output queue 67 (or queues) the frame pointer associated with the port vector should be input. The port vector FIFO 63 assigns the frame pointer to the appropriate destination port(s) by placing the frame pointer into the top of the appropriate output queue 67, queuing the transmission of the data frame from the corresponding destination port. Hence, the frame pointer becomes an "assigned frame pointer," where it is assigned to a destination port.

At some point in time, the assigned frame pointer reaches the bottom of the output queue 67 after passing through the output queue 67. The buffer manager 65 takes the assigned frame pointer from the bottom of the output queue 67 using a frame pointer read bus 86, fetches the corresponding data frame in a DMA transaction from the location in external memory 36 pointed to by the assigned frame pointer and places the fetched data frame into the appropriate transmit FIFO 66 via a data bus 82 (see FIG. 2) for transmission by the corresponding MAC layer.

A multicopy transmission is similar to the unicopy transmission, except that the port vector has multiple bits set, designating the multiple destination ports from which the frame will be transmitted. The frame pointer is assigned (i.e., stored in) each of the appropriate output queues 67 and transmitted from the corresponding transmit FIFOs 54.

The buffer manager 65 uses the special control queues, e.g., the free buffer pool 104, the multicopy queue 90, the reclaim queue 98, and the multicopy cache 96 to manage the process of allocating buffers to store received data frames, and retrieving buffers for re-use once the frame has been transmitted to its designated output port (s). The buffer manager 65 also maintains "overflow" regions in external memory 34 for the output queues 67, 75, 77 and the control queues 104, 90 and 98. Specifically, these queues each include a three-part configuration including on-chip and off-chip storage locations. On-chip storage is preferable for high performance, where all of the queuing structure is maintained on the chip (referring to the multiport switch 12). However, the real estate on a chip is very expensive and real estate costs create a problem when the chip is designed to switch, and needs to queue, a large number of entries. The present invention solves this dilemma by providing a single output queue that includes a high performance, low capacity section that is on-chip, and an overflow area that is off-chip, i.e., is implemented on a separate discrete memory chip 34. The overflow area thus allows the queue to serve as a large capacity queue as needed and is configured within the output queue in a manner that the a relatively lower performance of the off-chip overflow area does not adversely affect the overall performance of the output queue.

Each logical queue 67, 75, 77, 90, 98, and 104 of the present invention includes a write-side queue 76 and a read-side queue 78 located on the chip 12, and an output queue overflow area (generally designated as 110) located in an assigned portion of the external memory 34. Access to the external memory 34 for all of the output queues 67 is through the external memory interface 32, as described earlier. The present invention takes advantage of the bursting nature of current external memories, so that the overflow data (e.g., frame pointers) is sent on and off the chip to the overflow queue area 110 in bursts over the bus 84 to the external memory 34.

The write-side queue 76 and the read-side queue 78 located on the chip 12 are considered to be small, expensive, and high-performance resources. By contrast, the overflow area 110, forming the third part of the output queue 67, provides a large, inexpensive, low-performance, large capacity path.

Each buffer 67, 75, 77, 90, 98, and 104 operates by the corresponding write-side queue 76 receiving the corresponding frame pointer entry at an input end of the write-side queue 76. The frame pointer points to the first buffer location in external memory storing the first 256 bytes of a data frame.

After the entry flows through and reaches the output end at the bottom of the write-side queue 76, control logic associated with the output queue 67 selects whether the entry should be output to the corresponding assigned portion 110 of the external memory 34 or the read-side queue 78. If there is available space in the read-side queue 78, and the overflow area 110 for that output queue 67 is empty, then one or more entries are passed directly from the write-side queue 76 to the read-side queue 78. This passing of the entry or entries directly from the write-side queue 76 to the read-side queue 78 is performed entirely on the chip 12 and, thus, provides a low-latency, fast flow-through of an entry.

If the read-side queue 78 is full, but there is not yet a burst-size amount of data in the write-side queue 76, then the entry remains in the write-side queue 76. If the read-side queue 78 is full and there is at least a burst-size amount of data (e.g., 16 bytes worth of entries) in the write-side queue 76, then the data is written in a burst fashion by the buffer manager 65 into the overflow area 110 in the corresponding assigned portion of the external memory 34. Eventually, the read-side queue 78 will empty, and if there is data in the overflow area 110, the buffer manager 65 will supply a burst of data from the overflow area 110 into the read-side queue 78 when the read-side queue 78 has enough space to accommodate the burst-size amount of data. Hence, the read-side queue 78 selectively receives the frame pointer from the write-side queue 76 or the assigned portion 110 of the external memory 34.

Hence, if an output queue 67 begins to receive a large number of entries (e.g., frame pointers), these entries can be placed into the overflow area 110 to avoid overflowing the on-chip queue 78, minimizing possibility of discarding frames. The total amount of memory dedicated to the overflow areas 110 may also be readily changed by changing the size of the external memory 36. Furthermore, the sizes of the individual specific overflow areas 110 are programmable to customize the queue sizes, without impacting the performance of the output queues 74.

The multiport switch as depicted in FIGS. 1 and 2 has twenty-eight output queues serving the twenty-four 10 Mb/s user ports 60, the two 100 Mb/s server ports 62, the management port 36, and the expansion bus port 38, respectively. The output queues 67, 75 and 77 provide temporary storage for frame pointers when they are queued for transmission. Queuing takes the form of the port vector FIFO 63 writing frame pointers into the various output queues 67, 75 and 77 indicated in a forwarding port vector.

Figure 4:
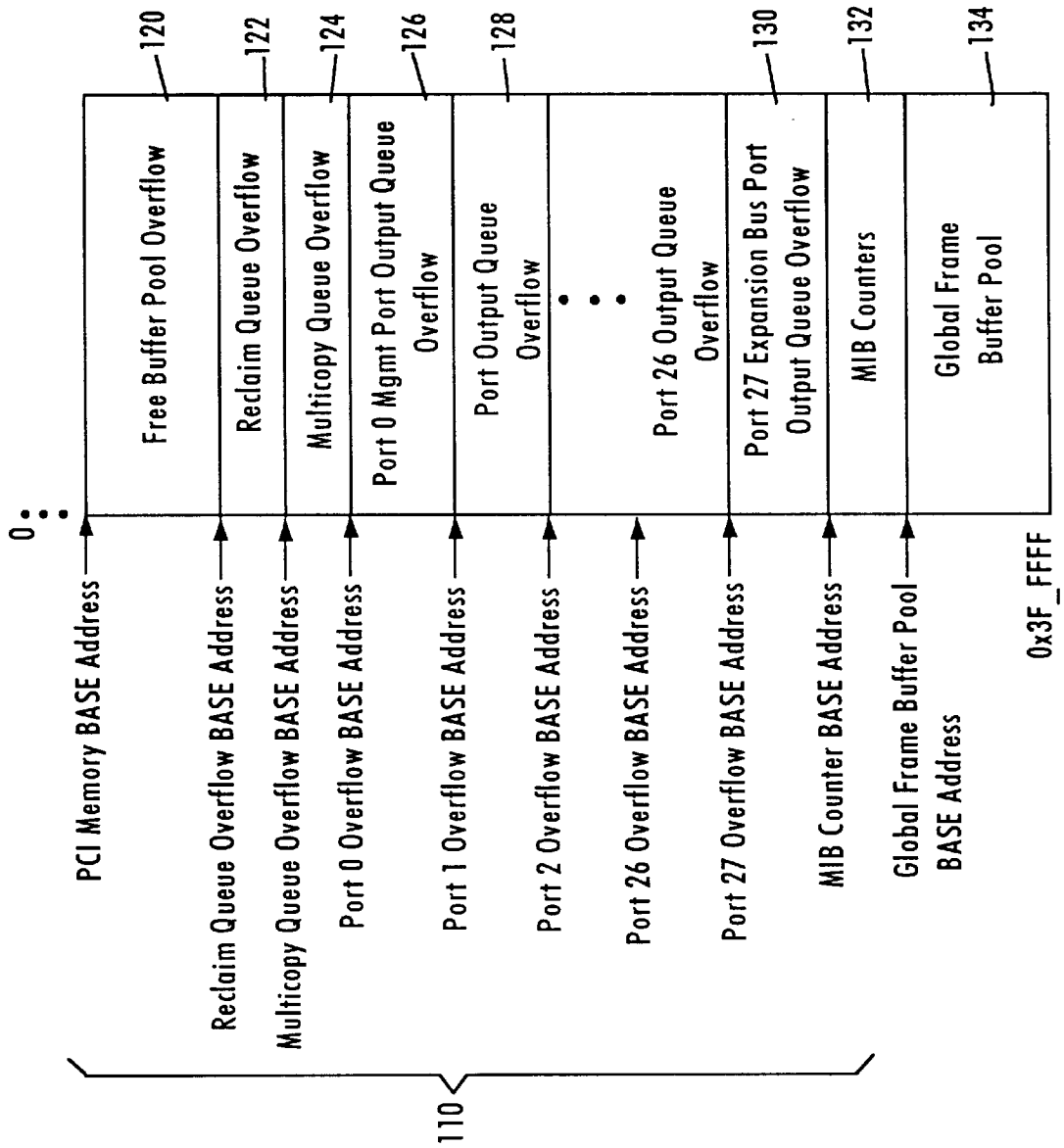
FIG. 4 is a diagram illustrating an exemplary map of an external memory in the multiport switch.

FIG. 4 is a diagram illustrating an exemplary map of the external memory 34. The overall capacity of the external memory 34 may be, for example, 4 Mb, although other capacity memories are employed in different embodiments. The use of an external memory 34 for the overflow areas according to the present invention permits increasing or decreasing the size of the output queues by simply changing the external memory. This is an advantage over systems in which the queue structure is entirely on the chip, as the overall queuing capacity is set at manufacture of the chip.

To satisfy the overflow storage requirements of the switch 12, the overflow region 110 of the external memory 34 has assigned memory portions for a free buffer pool overflow 120, a reclaim queue overflow 122, a multicopy queue overflow 124, a management port output queue overflow 126, output queue overflows 128 for each of the 10 Mb/s and 100 Mb/s destination ports (Ports 0–26), and an expansion bus port (Port 27) output queue overflow 130. The memory 34 also includes assigned portions for the MIB counters 132, and the global frame buffer pool 134.

The BASE Address for the entire memory region is programmable in a memory base address register among the registers 74 on the chip. The BASE Address for each area in the external memory map is programmable in the register set. No length register is required, since the length for a given area is equal to the area from that area's BASE Address to the BASE Address of the next adjacent area in the mapping.

Since the length (and therefore capacity) of each of the individual overflow areas is programmable, the overall capacity of each queue is programmable. This feature of the present invention permits customization of the switch to provide particular output queues with increased capacity, as needed.

The overflow areas 110 store excess entries that do not fit into the control queues on the chip 12. For example, the free buffer pool overflow area 120 stores for the free buffer pool 104 the excess free frame pointers identifying the currently unused buffers in the global frame buffer pool 134. The reclaim queue overflow area 122 stores for the reclaim queue 98 excess frame pointers to linked-list chains that are no longer needed. The multicopy queue overflow area 124 stores for the multicopy queue 90 excess frame pointers with copy numbers ">=1" (for queued frame pointers) and frame pointers with copy numbers "−1" (for successfully transmitted frames). The management port output queue overflow area 126 stores for the management port queue 74 excess assigned frame pointers awaiting transmission to the management port 36 (Port 0). Output queue overflow areas 128 store excess assigned frame pointers awaiting transmission to the appropriate 10 Mb/s ports (Ports 1–24) or 100 Mb/s ports (Ports 25–26) for the respective port queues 67. The expansion bus port output queue overflow area 130 for the expansion bus port (Port 27) queue 77 stores frame pointers awaiting transmission to the expansion bus port.

The MIB counter region 132 contains all the per port statistics which are updated periodically by the switch 12. The switch 12 maintains 8-bit and 16-bit counters on-chip for storing MIB statistics. The switch 12 updates the 32-bit or 64-bit MIB counters in external memory 36 with the frequency required to prevent loss of MIB data.

The global frame buffer pool 134 contains buffers in linked-lists which store received frame data. At any given time, these linked lists contain valid frame data, obsolete buffers which will be returned by the buffer manager 72 to the free buffer pool 104, or locations owned by the PCI host processor 40.

As shown in FIG. 2, the multiport switch 12 comprises the management data interface 72 for accessing control and status registers in the external physical layer devices (PHYs) including the 10 Mb/s switching transceivers 20 and the 100 Mb/s PHYs 26. For example, the AM79C989 Quad Ethernet Switch Transceiver QuEST™ may be used as the switching transceiver 20.

The management data interface 72 that complies with the IEEE 802.3u standard allows the external PHYs to be polled for their status information and enables the IMS 12 to alter operating parameters of the external PHYs.

In conformance with the MII Management Interface provisions of the IEEE 802.3u standard, the management data interface 72 includes a management clock output pin for supplying a management data clock (MDC) to the external PHYs and a serial data input/output pin for transmitting or receiving a bidirectional management data input/output (MDIO) signal to or from the external PHYs. The MDC may be generated at a frequency of 2.5 MHz. The MDIO signal serves as a control signal and data. Its format corresponds to the MII management frame format specified in the IEEE 802.3u standard.

As shown in FIG. 5, the MII management frame may begin with a preamble composed of 32 logic "ones" generated to synchronize all of the external PHYs with the interface. If the status register in an external PHY indicates that the PHY supports communications with suppressed preambles, the preamble of the management frame may be dropped after reading the status register of that PHY.

The preamble is followed by a start field ST and an operation field OP. The ST field is a delimiter indicated by pattern "01". The OP field indicates whether the IMS 12 initiates a read operation or a write operation.

A 5-bit PHY address field PHYAD identifies the address of the specific external PHY to be accessed. The PHYAD is the unique address of any PHY connected to the management data interface 72. A 5-bit register address field REGAD indicates the specific register to be accessed in the external PHY. For example, the IMS 12 may read status information from summary status register (not shown) in the QuEST™ device.

The address fields are followed by a bus turn around field TA that provides a two-cycle delay for redirecting the MDIO bus during read operations, to avoid signal contention. The TA field is used to determine whether the external PHY responds correctly to a read request or not. If an accessed external PHY is synchronized to the IMS 12, the PHY drives a zero level signal in response to the MDIO signal from the IMS. If the external PHY does not drive a zero level signal, the IMS 12 produces a MII management frame read error to invalidate the data read from the PHY.

A 16-bit data field DATA contains data read from an external PHY during a read operation or to be written into an external PHY during a write operation. The management frame terminates with an IDLE field which indicates an idle state of operation and gives time for drivers to turn off before the next access.

Figure 6:
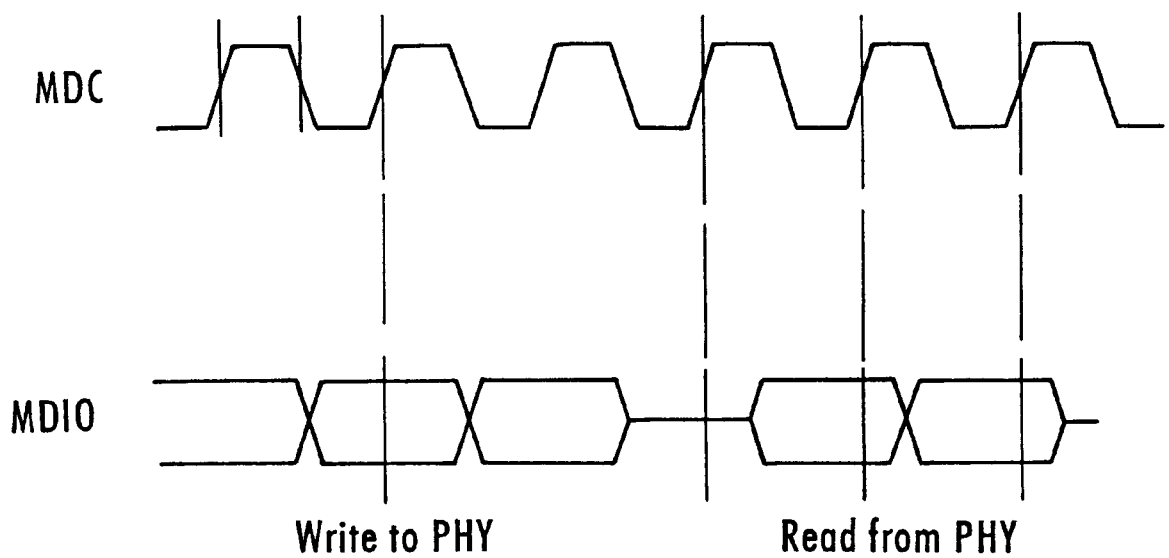
FIG. 6 is a timing diagram of a management data interface.

As shown on a management data interface timing diagram in FIG. 6, the MDIO is a tri-state signal synchronous to the rising edge of the MDC. In the idle state, the IMS 12 drives the MDC low and the MDIO signal into an intermediate state.

Figure 7:
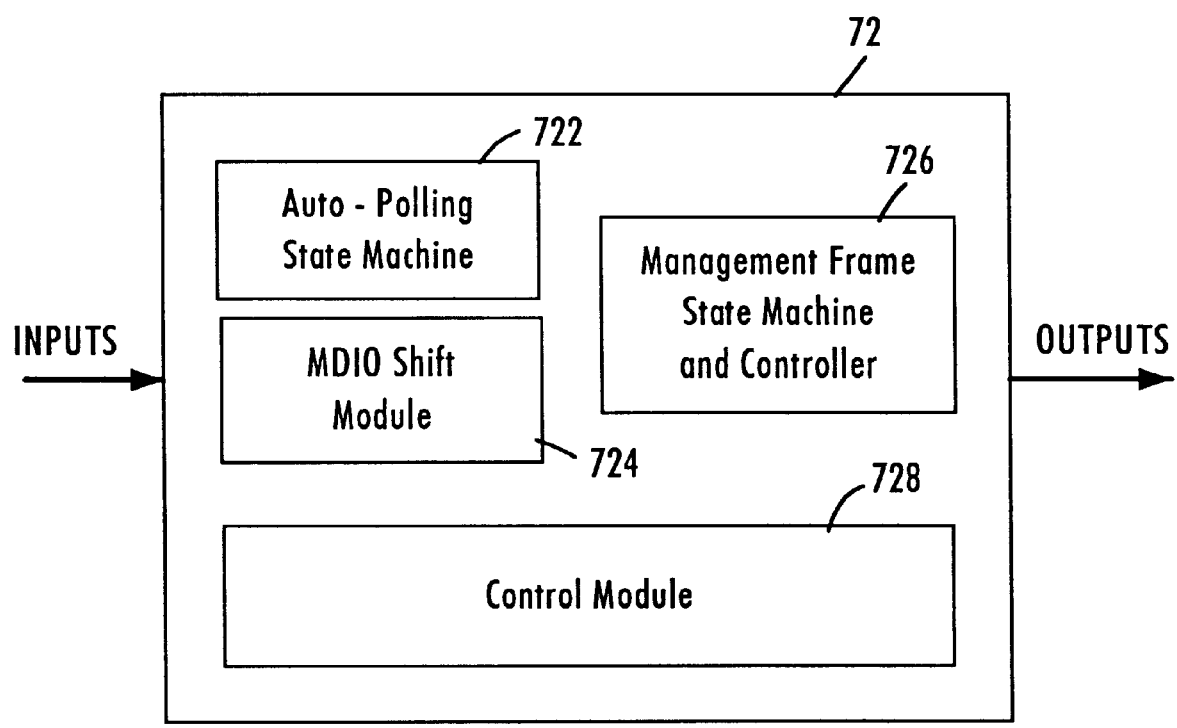
FIG. 7 is a block diagram of an exemplary management data interface in the multiport switch.

Referring to FIG. 7, the management data interface 72 comprises an auto-polling state machine 722, an MDIO shifting module 724, a management frame state machine and controller 726 and a control module 728. The auto-polling state machine 722 automatically polls every external PHY at regular time intervals. For example, the auto-polling procedure may be performed every 64 MDC cycles.

A preset auto-polling sequence provides interrogation of every PHY in succession to determine changes in PHY's status. Also, the auto-polling procedure allows the IMS to determine whether the external PHYs have completed an auto-negotiation procedure prescribed by the IEEE 802.3 standard. For example, the auto-polling sequence may begin with sequential polling of the 10 Mb/s switching transceivers 20 followed by sequential polling of 100 Mb/s PHYs 26.

The auto-polling state machine 722 may cause the IMS 12 to perform a transition from an idle state to a read state, in which a combination of the MDC and MDIO signals is used to read data from the external PHY. Simultaneously, the management frame state machine 726 controls the IMS 12 to sequentially process each field of a management frame transmitted or received to or from every external PHY connected to the IMS 12. In particular, the management frame state machine 726 causes the IMS transition from the idle state to a state corresponding to processing of the management frame preamble. Then, the management frame state machine 726 sequentially moves the IMS via the sequence of states corresponding to each field of the management frame. If the previous read operation indicates that the preamble may be dropped, then the IMS is moved from the idle state directly to the ST state.

The MDIO shifting module 724 shifts the serial MDIO signal into and out of the IMS 12 to provide read access to a required PHY and read its status information. The MDIO input/output procedure, together with the MDC output procedure, are performed in accordance with IEEE 802.3u standard.

The control module 728 controls the polling sequence, captures the status of the external PHYs, and updates status registers in the IMS in accordance with the most current status information. In particular, the IMS 12 may comprise status registers for each of the ports 1–24 supporting the 10 MB/s switch transceivers 20 and for ports 25 and 26 supporting the 100 MB/s PHYs 26. These registers maintain control and status information on the external PHYs connected to corresponding ports. For example, the control module 728 may use the status information received from the external PHYs to update such status register data as full duplex status and link status for ports 1–26 and flow-control status for ports 25–26.

Also, the IMS 12 may have a PHY status change interrupt register that indicates whether the configuration of the PHY for any port 1–26 has changed. If the current polling procedure indicates that the contents of the status register in any of the PHYs connected to ports 1–26 changes compared to the previous polling procedure, the control module 728 causes the appropriate interrupt bit in the PHY status change interrupt register to be set, to send an interrupt signal to the host processor 40.

In accordance with the present invention, the auto-polling procedure is interleaved with management accesses to the external PHYs performed by the host processor 40 using the management data interface signals MDC and MDIO.

A PHY access register arranged in the PCI control/status register section 74 is employed to support the management accesses to the external PHYs initiated by the host processor 40 that communicates with the PHY access register via the PCI interface 39.

For example, the PHY access register may contain such address and data information as 16-bit management data MANDATA, a 5-bit register address REGADD, and a 5-bit PHY address PHYADD. As discussed in more detail later, this information is used for management write and read accesses to the external PHYs performed by the host 40.

Also, the PHY access register may incorporate a management busy bit MANBUSY indicating whether or not the management access is in progress. It is noted that the MANBUSY bit reflects only access requested by the host, and does not reflect accesses to the PHYs during the auto-polling procedure.

A management access bit MANACC may be provided in the PHY access register for indicating a type of management access operation. For example, the MANACC bit may be "1" for a management write operation and may be "0" for a management read operation.

A management read error bit MANRDERR may indicate a management frame read error. For example, this bit may be "1" if the external PHY did not provide a proper response to a read access.

A preamble suppression enablement bit ENPRESUPP indicates whether or not preamble suppression should be enabled during the management access. If the previous read from an external PHY indicates that the PHY will accept management frames with suppressed preambles, the ENPRESUPP bit may be set to "1" to enable preamble suppression.

When the host 40 desires to write management data into a particular register of a particular external PHY, the host 40 performs a PCI access to the PHY access register and places the address of the PHY in the PHYADD field, the register address in the REGADD field, and the data in the MANDATA field. While the write operation is in progress, the MANBUSY bit is set. When the write operation is complete, the MANBUSY bit is cleared. The MANACC bit may be set to indicate that a write operation is performed.

The MANDATA, PHYADD, REGADD, MANACC, MANBUSY and ENPRESUPP bits from the PHY access register are transferred to the inputs of the management data interface 72 to enable the management frame state machine and controller 726 to produce and transmit a MDIO management data frame that contains the MANDATA bits in its DATA field, the PHYADD bits in its PHYAD field, and the REGADD bits in its REGAD field. In accordance with the IEEE 802.3u standard, the management data frame is transmitted to the required external PHY via the MDIO pin, together with the MDC supplied via the MDC pin. For example, the host 40 may write management data to the appropriate register of an external PHY to change the operation parameters or configuration of the PHY.

When the host initiates a management access to a particular PHY to read information from its particular register, the host performs a PCI access to the PHY access register to place the PHY address in the PHYADD field and the register address in the REGADD field. While the read operation is in progress, the MANBUSY bit is set. When the operation is complete, the MANBUSY bit is cleared. The deasserted MANACC bit may indicate that a read operation is performed.

The PHYADD, REGADD, MANACC, MANBUSY and ENPRESUPP bits from the PHY access register is transferred to the inputs of the management data interface 72 to produce the MDIO management frame and MDC for reading data from the PHY's register indicated by the host. The management data read from the required register of the external PHY is transferred to the PHY access register and placed in its MANDATA field. If no management frame read error is detected, the MANDATA bits are considered valid and transferred to the host via the PCI interface. When the host processor performs management access to the external PHYs to write or read management data, a freeze signal may be supplied to the management data interface 72 to stop the auto-polling procedure until the host management access is completed.

There accordingly has been described a system for managing external physical layer devices (PHYs) that polls in succession every external physical layer device coupled to a multiport data communication switch to determine status and control information relating to the external PHYs. The polling procedure performed automatically at regular time intervals is interleaved with management accesses to the external PHYs initiated by a host processor. The host management access may be performed to write or read management data to or from a particular register in a particular external physical layer device.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

What is claimed is:

1. A data communication system controlled by a host processor and having multiple ports coupled to external physical layer devices, comprising:

a management data interface for automatically polling said physical layer devices at regular time intervals, and a management access register responsive to said host processor for storing management access information to support host management accesses to said physical layer devices initiated by said host processor, wherein said management data interface is responsive to the management access information from said management access register to alternate said polling with said host management accesses.

2. The system of claim 1, wherein said management access register is responsive to address data and management data provided by said host processor to support writing said management data into an external physical layer device corresponding to said address data.

3. The system of claim 2, wherein said address data comprises address of the external physical layer device to be accessed and address of a register to be accessed in said external physical device.

4. The system of claim 1, wherein said management access register is responsive to address data provided by said host processor to support reading management data from an external physical layer device corresponding to said address data.

5. The system of claim 4, wherein said management access register receives said management data read from said external physical layer device.

6. The system of claim 1 further comprising a PCI interface for interfacing said host processor to said management access register.

7. The system of claim 1, wherein said management data interface supplies each of said external physical layer devices with a management data clock (MDC) and a management data input/output (MDIO) signal to provide said polling and said host management accesses.

8. The system of claim 7, wherein said MDIO signal carries address and management data provided by said host processor for said host management accesses.

9. The system of claim 1, wherein said management data interface provides automatic polling of status registers in said external physical layer devices to determine status of said external physical layer devices.

10. The system of claim 9, wherein said management data interface provides host management accesses to write management data into selected registers of said external physical layer devices to alter operating parameters of said external physical layer devices.

11. A method of managing external physical layer devices coupled to ports of a data communication switch controlled by a host processor, comprising the steps of:

automatically polling said external physical layer devices at regular time intervals, supplying an access register in said data communication switch with management access information provided by said host processor to support management accesses to said external physical layer devices, and alternating said polling with said management accesses to said external physical layer devices.

12. The method of claim 11, wherein said management accesses are initiated by said host processor to write management data into a selected register in a selected physical layer device.

13. The method of claim 12, wherein said management access information contains said management data and addresses of said selected register and said selected physical layer device.

14. The method of claim 11, wherein said management accesses are initiated by said host processor to read management data from a selected register in a selected physical layer device.

15. The method of claim 14, wherein said management access information contains addresses of said selected register and said selected physical layer device.

16. The method of claim 15, wherein said management data read from said selected register is stored in said access register before reading by said host processor.

17. The method of claim 11, wherein a management data clock (MDC) and a management data input/output (MDIO) signal are used to provide said polling and said management accesses.

* * * * *